United States Patent [19]

Lesche

[11] 4,198,575
[45] Apr. 15, 1980

[54] CIRCUIT ARRANGEMENT RESPONSIVE TO CONTROL SIGNALS FOR GENERATING AND STORING A VARIABLE ELECTRICAL ANALOG SIGNAL

[75] Inventor: Wolfgang Lesche, Berlin, Fed. Rep. of Germany

[73] Assignee: Siemens Aktiengesellschaft, Munich, Fed. Rep. of Germany

[21] Appl. No.: 795,514

[22] Filed: May 10, 1977

[30] Foreign Application Priority Data

May 19, 1976 [DE] Fed. Rep. of Germany ....... 2622847

[51] Int. Cl.² .......................... H03K 5/20; H03G 9/06
[52] U.S. Cl. .................................. 328/133; 307/232; 307/269; 328/61
[58] Field of Search ...................... 328/61, 39, 133, 72, 328/134, 155, 140, 141; 307/232, 225, 269, 271

[56] References Cited

U.S. PATENT DOCUMENTS

| | | | |
|---|---|---|---|
| 3,374,359 | 3/1968 | Anderson | 307/225 R |
| 3,721,909 | 3/1973 | Pincus | 328/133 |
| 3,723,889 | 3/1973 | Oberst | 307/225 |
| 3,789,304 | 1/1974 | May | 328/61 |

Primary Examiner—Stanley D. Miller, Jr.
Assistant Examiner—B. P. Davis
Attorney, Agent, or Firm—Kenyon & Kenyon

[57] ABSTRACT

A circuit arrangement comprising first and second frequency dividers which are responsive to the output signal of a clock generator and to control signals. The circuit arrangement further includes means for generating an analog signal corresponding to the phase difference between the frequency divider output signals. By varying the control signals, the aforesaid phase difference and, hence, the generated analog signal corresponding thereto can be varied.

3 Claims, 8 Drawing Figures

CIRCUIT ARRANGEMENT RESPONSIVE TO CONTROL SIGNALS FOR GENERATING AND STORING A VARIABLE ELECTRICAL ANALOG SIGNAL

BACKGROUND OF THE INVENTION

1. Field of the Invention

This invention relates to a circuit arrangement responsive to control signals for generating and storing an electrical analog signal whose magnitude can be varied by varying the control signals.

2. Description of the Prior Art

In the Motorola "McMOS Handbook", 2nd Edition, 1974 at page 114, a circuit arrangement is disclosed which comprises two frequency dividers which are fed pulses and which are followed by a multivibrator. This circuit, however, functions as a digital-to-analog converter and does not generate and store an analog signal which can be varied by varying control signals.

Additionally, there is presently being manufactured by Siemens a programmable analog memory under the type number S 175. This memory includes for each analog signal to be stored a reversible counter, the count of which is converted into an analog output signal by a digital-to-analog converter. Such memories are used, for example, in television sets in order to convert the control signals arriving from the remote control into analog signals for adjusting the volume, brightness, color saturation of the television. The disadvantage of the memories is that they employ expensive reversible counters.

It is an object of the present invention to provide a circuit arrangement for generating and storing an analog signal which is of less complex construction than known arrangements.

SUMMARY OF THE INVENTION

In accordance with the principles of the present invention, the above and other objectives are accomplished in a circuit arrangement comprising first and second frequency dividers which are responsive to the output signal of a clock generator and to control signals. The circuit arrangement further includes means for generating an analog signal corresponding to the phase difference between the output signals of the frequency dividers. By varying the control signals, the aforesaid phase difference and, hence, the generated analog signal corresponding thereto can be varied.

In the arrangement of the invention, the desired analog signal is, therefore, derived from the phase difference of the output pulses of the first and second frequency dividers. If the magnitude of the analog signal is to remain unchanged and the frequency dividers have the same step-down ratio and are employed, the frequency dividers are addressed by the same number of clock pulses, so that they count through with the same cycle frequencies to thereby establish a set phase difference of their output pulses. For situations where it is desired to change the phase difference of the output pulses and, therefore, to magnitude of the analog signal, various forms of the aforesaid arrangement can be employed.

In one form of the arrangement, the frequency dividers have the same step-down ratio and are acted upon by a single clock generator via logic members. These logic members are gate circuits which suppress passage of the clock pulses of the clock generator to either one or the other of the frequency dividers, depending on whether the phase difference is to be decreased or increased. The aforesaid logic members may also be designed so that their outputs can be added to the one or to the other of the frequency dividers via addition pulses of the clock generator.

In another form of the arrangement, the first frequency divider is fed clock pulses at a constant frequency, while the second frequency divider is preceded by a logic member which has three operating states. In a first state, it passes-on the same number of clock pulses per unit time to the second frequency divider as the number of clock pulses per unit time arriving at the first frequency divider. In second and third states, it passes on a larger number and smaller number of clock pulses per unit time than the number arriving at the second divider.

In still another form of the arrangement, at least one of the two frequency dividers is switched to another divider ratio by the control signal. If both frequency dividers are switched, then it is sufficient if the frequency dividers can be switched to two divider ratios. If, however, the divider ratio of the first frequency divider is constant and if the latter is driven by pulses of constant frequency, then the second frequency divider should be switchable to three operating states. In the first state, the divider ratio is the same as that of the first frequency divider. In the second state and third states, the divider ratio is smaller and larger, respectively, than that of the first frequency divider. The dividers may be switchable, for instance, from 1000:1 to 999:1 or to 1001:1.

In a further form of the arrangement, the first frequency divider is connected, for changing the output signal, to an oscillator of constant frequency and the second frequency divider is preceded by an oscillator of variable frequency. If the analog signal is to remain unchanged, i.e., there is no control signal, then the two oscillators are rigidly coupled with each other. If a control signal appears, the frequency of the one oscillator is increased or decreased relative to that of the other one. If there is no control signal, one oscillator can also drive both frequency dividers.

If the control signal is a constant signal and if all input pulses for one frequency divider are cut off, for instance, by means of a logic member, than the analog signal is changed very quickly. A slower change can be achieved by a further form of the arrangement wherein releasing of the control signal is carried out by a timing generator with a small duty cycle. The phase difference of the output pulses of the frequency dividers is then changed only during short periods of time, so that a gradual change of the analog output signal results.

If the control signal being used is an analog signal, another form of the circuit arrangement can be employed wherein the analog control signal is advantageously fed to a three-point switch which generates, as a function of the amplitude and the polarity of the analog control signal, a digital control signal for application to a logic member, a frequency divider with changeable divider ratio or a clock generator with a variable frequency. If the three-point switch is provided with negative feedback via a lowpass filter, one obtains a pulse-duration modulator which delivers control signals with a duty cycle which is approximately proportional to the magnitude of the analog control signal, i.e., the larger the control signal, the faster is the phase difference of the output pulses of the frequency dividers and thereby, the change in the analog output signal.

If several analog signals are to be generated and stored, then a further circuit arrangement can be used wherein a first storage frequency divider is provided for each analog signal. The output signal of this storage frequency divider is fed to one input of a respective phase comparator, the other input of which is connected to the second frequency divider which serves as a reference frequency divider. The reference frequency divider is coupled to the phase comparator means associated with each storage frequency divider and the reference divider always has the same divider ratio and is always stepped with a constant frequency. At the storage frequency divider arrangements, as above-described, are employed for changing the divider ratio, changing the frequency of the clock pulses or blocking the clock pulses, so as to obtain a changing phase difference.

The phase comparator means used in the above-described arrangements of the invention can take on various forms. In one form the comparator includes a bistable multivibrator whose inputs are connected to the outputs of the first and second frequency dividers, and a filter which follows the bistable multivibrator. With this type of comparator, the analog output signal can be derived at the output of the filter.

A second form of phase comparator means can be advantageously employed with yet another form of the circuit arrangement of the invention wherein the first and second frequency dividers are counters of equal counting capacity whose digital outputs are connected to the inputs of a computing circuit which functions as the phase comparator means. The computing circuit forms from the difference of the pulses summed in the two counters, a digital value corresponding to the analog output signal and controls with polarity or transmission signals a doublethrow switch to which, on the one hand, a reference voltage and, on the other hand, ground potential is supplied and to which is connected a lowpass filter at whose output the analog output signal appears. In this arrangement, a digital signal is, thus, available in addition to the corresponding analog output signal.

In a further form of the arrangement of the invention, the output of each comparator means can be coupled to a respective feedback circuit which compares the phase difference of the output of the comparator means with an analog input signal and delivers, depending on the result of the comparison, an output signal which is used as the control signal for changing the phase difference. For storing several analog signals, a storage frequency divider is used for each analog signal. One feedback network can be provided for each storage frequency divider, so that the phase difference of the output pulses of several storage frequency dividers and the output pulses of the reference frequency divider can be changed simultaneously. However, it is also possible to use only one feedback network which is connected to a storage frequency divider selectively.

BRIEF DESCRIPTION OF THE DRAWINGS

The above and other features and aspects of the present invention will become apparent upon reading the following description in conjunction with the accompanying drawings in which.

DETAILED DESCRIPTION

Figure 1:
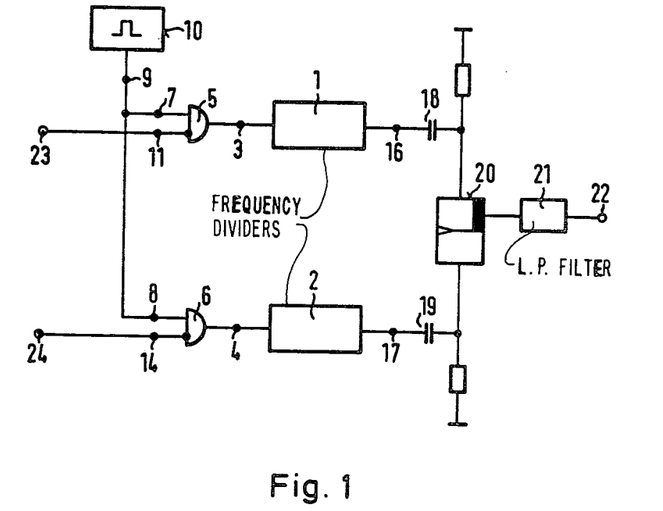
FIG. 1 shows a circuit arrangement for generating an analog signal in accordance with the principles of the present invention.

FIG. 1 shows a circuit arrangement in accordance with the principles of the present invention. As shown, the arrangement comprises two frequency dividers 1 and 2 having the same divider ratio and to whose inputs 3 and 4 are connected the outputs of respective gate circuits 5 and 6. The inputs 7 and 8 of the gate circuits 5 and 6 are connected, respectively, to the output 9 of a clock generator 10. The inputs 11 and 14 of the gate circuits 5 and 6, in turn, are connected to the inputs 23 and 24, respectively, the latter inputs being responsive to control signals for generating and changing an analog output signal developed at the output 22 of the arrangement.

The outputs 16 and 17 of the frequency dividers 1 and 2 are connected, via respective differentiating members comprising capacitors 18 and 19, to the two inputs of a bistable multivibrator 20. The multivibrator 20 is followed by a lowpass filter 21, the output 22 of which serving as the output of the circuit arrangement.

Figure 2:
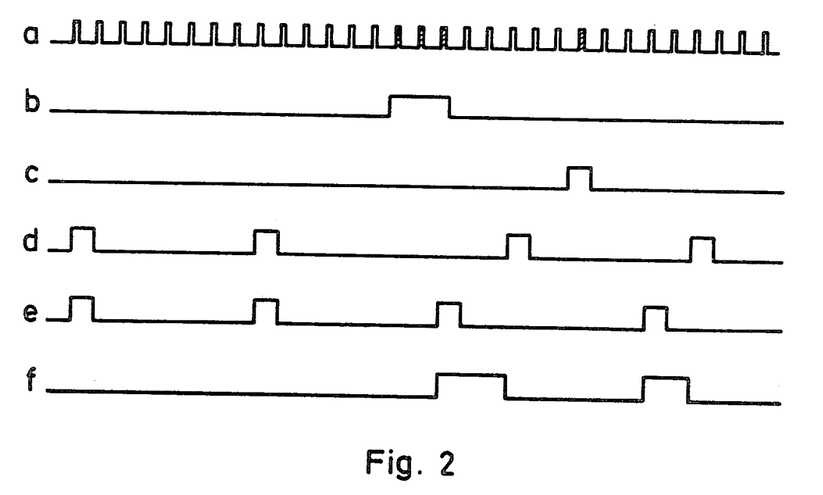
FIG. 2 illustrates waveform diagrams for explaining the operation of the arrangement of FIG. 1.

The operation of the circuit of FIG. 1 will now be described by making reference to FIG. 2 wherein: waveform a is the waveform of the clock pulses appearing at the output 9 of the clock generator 10; waveform b is the waveform of the control signal at the input 23; waveform c is the waveform of the control signal appearing at the control input 24; waveforms d and e illustrate the output pulses at the capacitors 18 and 19, respectively; and waveform f is the waveform of the output pulses of the bistable multivibrator 20.

For the purposes of discussion, it is assumed that the frequency dividers 1 and 2 both have a divider ratio of 8:1, so that, as shown, by the waveforms d and e each delivers an output pulses after every eighth clock pulse, if no control signal is present at the inputs 23 and 24. It is further assumed that both dividers have been reset to zero at the same time, so that initially their output pulses appear simultaneously and are in phase. With no control signals, therefore, the multivibrator does not change state and its average output signal, which appears at the output 22, is zero.

If the control signal shown by the waveform b is now applied to the input 23, three clock pulses are suppressed by the gate circuit 5, thereby causing the delivery of an output from the frequency divider 1 to be delayed by three clock pulse periods. As a result, an output signal occurs at the output of the frequency divider 2, while no output signal appears at the output of the frequency divider 1. This, in turn, causes the multivibrator 20 to switch or change state and it remains in such changed condition until it is switched back three clock pulse periods later by the output signal appearing at the frequency divider 1 output. The resultant changes in state of the multivibrator 20 causes the first pulse of the waveform f to be produced.

If only the control signal shown by the diagram of waveform b is applied to the circuit arrangement, a similar pulse as the first pulse of the waveform f will appear at the output of the multivibrator 20 during every counting cycle of the frequency dividers 1 and 2, and an analog signal which is equal to the average value of such output pulses will appear at the output 22. However, as indicated by waveform c of FIG. 2, a control pulse is also applied to the input 24. This pulse causes a single clock pulse to be blanked out or suppressed by the gate circuit 6, thereby delaying the output pulse of the frequency divider 2 by one clock pulse period. The resultant effect on output pulse of the multivibrator 20 is to shorten the pulse length to two clock pulse periods and this, in turn, causes the analog signal being delivered at the output 22 to become correspondingly smaller.

As can be appreciated, therefore, in the circuit arrangement of the invention according to FIG. 1, the phase difference between the output pulses of the frequency dividers 1 and 2 is changed by blanking out pulses of the clock generator 10 by means of control pulses which are fed to the gate circuits 5 and 6 via the inputs 23 and 24. Alternatively, it is also possible to use as the frequency dividers 1 and 2 frequency dividers circuits having variable divider ratios which can be varied by connecting the control inputs of the dividers to the inputs 23 and 24. The arrangement might also be modified by providing each of the frequency dividers 1 and 2 with its own clock generator, at least one of which clock generators has a variable frequency and to feed the control signals to the clock generator control inputs. With latter type arrangement, if no control signals are applied, an equal number of pulses must be fed per unit time to the frequency dividers 1 and 2. This can be accomplished either by synchronizing the clock generators or by switching one clock generator to both frequency dividers if a control signal is not present.

Figure 3:
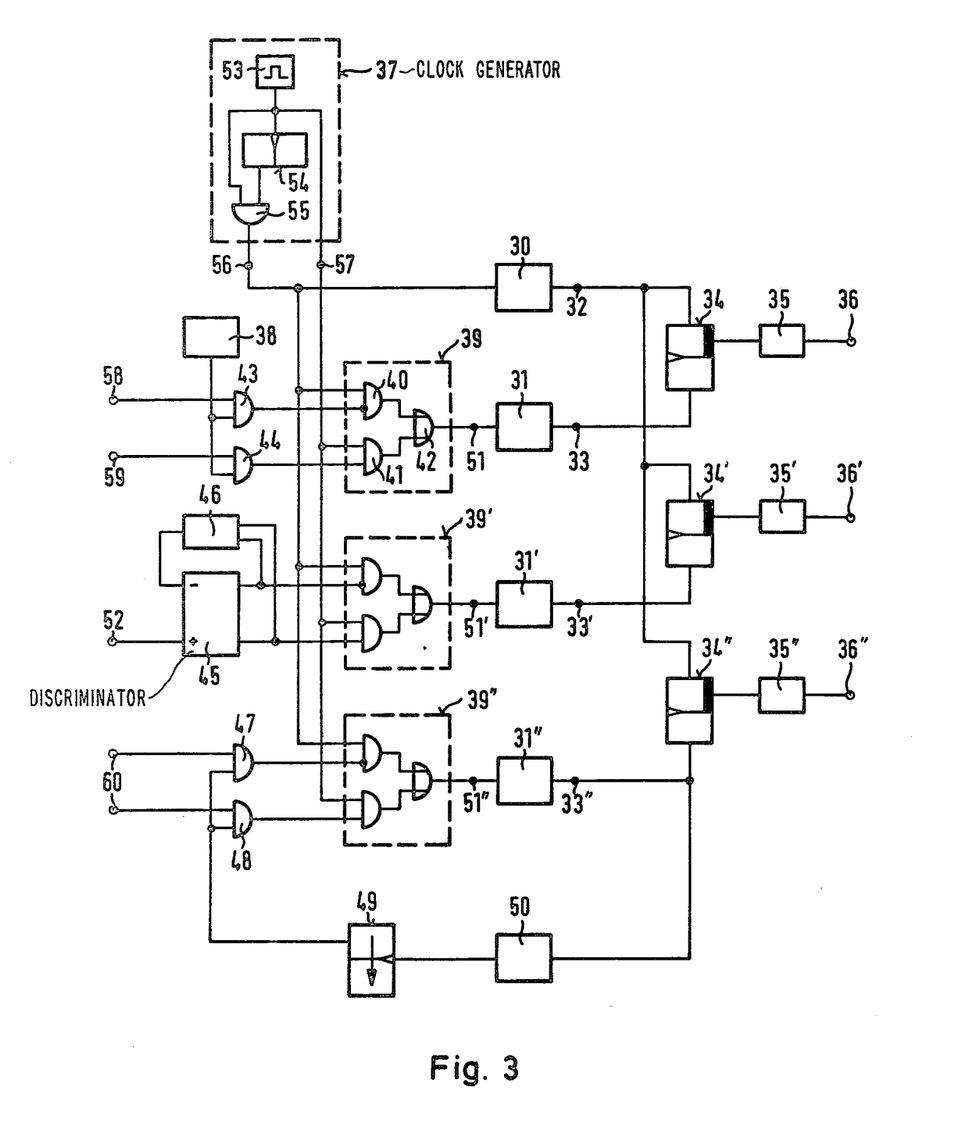
FIG. 3 shows an arrangement for generating and storing several analog signals in accordance with the principles of the present invention.

With the circuit arrangement of the invention illustrated in FIG. 3, three analog signals can be generated and stored. The aforesaid circuit arrangement comprises frequency dividers 30, 31, 31' and 31" each of which has an equal divider ratio. The dividers 31, 31' and 31" are storage frequency dividers and they are associated with the outputs 36, 36', 36", respectively, via which the analog signals are delivered. The frequency divider 30 serves as a reference frequency divider, the phase of the output pulses of the dividers 31, 31', 31", being determined relative to the phase of the reference output pulses of the divider 30 to derive the three output signals.

The output 32 of the reference frequency divider 30 is connected to one input of each of the bistable multivibrators 34, 34', 34", the other inputs of the multivibrators being connected to the outputs 33, 33', 33", respectively, of the storage frequency dividers 31, 31', 31". Unlike the circuit arrangement of FIG. 1, in the circuit arrangement of FIG. 3, differentiating members are not provided between the outputs of the frequency dividers and their respective bistable multivibrators, since either the multivibrators being employed will be designed to respond only to the flanks of the output pulses of the frequency dividers, or the frequency dividers being employed will be designed to provide only relatively short output pulses. However, as in FIG. 1, lowpass filters 35, 35', 35" are connected to the outputs of multivibrators 34, 34', 34".

The inputs 51, 51', 51" of the storage frequency dividers 31, 31', 31" are fed by logic members 39, 39', 39", each of which comprises two gate circuits 40, 41 whose outputs are coupled to an OR gate 42. Each logic member has four inputs, a first two of which are connected to two outputs of a clock generator 37 and the second two of which are fed by control signals.

The clock generator 37 delivers at its two outputs 56 and 57 two pulse trains of different frequency. The frequency of the pulse train present at the output 57 is that of an oscillator 53 which is included in the clock generator 37 and whose output is connected directly to the output 57. The output from the oscillator 53 is also coupled to a bistable multivibrator 54 which develops an output signal of half the frequency of the oscillator. The latter signal is linked with the output signal of the oscillator 53 in an AND gate 55, the output of which serves as the output 56 of the clock generator 37. At the output 56, therefore, appear pulses, the duration of which is equal to the pulses delivered via the output 57, the frequency of which, however, is half as high. The pulses appearing at the output 56 are fed directly to the reference frequency divider 30. The latter, therefore, is always stepped with constant frequency.

The control signal inputs of the logic member 39 are connected to the outputs of AND gates 43 and 44, the latter gates being fed control signals via the inputs 58 and 59. For the purposes of discussion, it will be first assumed that the inputs 58 and 59 are connected directly to the control inputs of the logic member 39, similarly to the inputs 23 and 24 of the arrangement of FIG. 1. In such case, if no control signal is applied to the inputs 58 and 59, i.e., if the logic signal "0" is present at these inputs, then the gate circuit 41 is cut off and the gate circuit 40 is released for the pulses appearing at the output 56 of the clock generator 37. These pulses are fed via the input 51 to the frequency divider 31, so that the latter is stepped with the same frequency as the reference divider 30. The phase difference of the output pulses of these two frequency dividers, therefore, remains constant. If a logical "1" signal is applied to the input 59, the gate circuit 41 is also released and the pulses appearing at the output 57 of the clock generator 37, which have twice the frequency of the pulses at the output 56, are coupled through to the frequency divider 31 thereby causing it to be stepped at a frequency higher than that of the reference frequency counter 30. A phase difference, thus, arises between output pulses of the frequency dividers 30 and 31. If, on the other hand, a "1" signal is present at the input 58 and a "0" signal at the input 59, then the logic member 39 cuts off the pulses of both frequencies at the outputs 56 and 57 and no pulses are coupled to the frequency divider 31. The frequency divider 31, thus, generates a zero output and the phase difference between the divider outputs is increased. It is, therefore, possible to increase, decrease or keep constant the phase difference of the output pulses of the frequency dividers 31 and 30 and, hence, to generate a variable analog signal at the output 36 by applying suitable control signals to the inputs 58 and 59.

With the circuit of FIG. 3 operated as above-described, i.e., with inputs 58 and 59 connected directly to the logic member 39, the phase difference of the output pulses of the frequency dividers can only be changed rapidly. A slow change can be obtained, however, by providing a clock generator which delivers three different frequencies which are very close together. The middle frequency would be fed to the reference frequency divider, while, for changing the phase difference, the higher or lower frequency would be fed to the storage frequency divider.

In the circuit arrangement of FIG. 3, a slow change of the phase difference between the output pulses of the storage frequency divider 31 and those of the reference frequency divider 30 is obtained by feeding the control signals applied to the inputs 58 and 59 to the logic member 39 via the gate circuits 43 and 44, the latter gates being controlled by a timing generator 38 which furnishes pulses having a small duty cycle. The control signals, therefore, are coupled to the logic member 39 only during the short pulse durations, so that the higher output frequency of the clock generator 37 is applied to the storage frequency divider 31 only during these short pulse durations, or the pulses are blocked. During the remainder of the time, the storage frequency divider 31 receives the same number of clock pulses per unit time as the reference frequency divider 30.

Each storage frequency divider can, of course, be preceded by an arrangement such as the one comprised of the gate circuits 43 and 44 and the timing generators 38, the timing generator 38, however, only needing to be provided once. An analogous type of arrangement is provided for the storage frequency divider 31″, with the exception that the timing signal generator is different. As shown, control signals are fed to inputs 60 which are coupled to the logic member 39″ via gate circuits 47 and 48. The latter gate circuits are released by a timing generator formed by a monostable multivibrator 49, the frequency divider 31″ and a further frequency divider 50. In particular, such releasing occurs during the unstable phase of the multivibrator 49 which is brought about by the output pulses developed by frequency dividers 31″ and 50″. The duty cycle of this arrangement is determined by the duration of the unstable phase of the multivibrators 49, the period of the pulses at the output 56 of the clock generator 37 and the step-down ratio of these pulses.

The use of an analog control signal for controlling a logic member is illustrated in the case of the logic member 39′ of the circuit of FIG. 3. Such an analog signal might be a voltage taken off at a voltage divider P. As shown, the analog signal is fed to an input 52 which is followed by a discriminator 45 which, in turn, addresses the logic member 39′. In the illustrative case shown, the discriminator 45 is a three-point switching circuit, at the two outputs of which a "0" signal appears if the signal fed to the input 52 is, for example, a "0" signal, and which delivers at one or the other of its two outputs a "1" signal, depending on whether the input signal is larger or smaller than a predetermined threshold. This arrangement is further provided with a lowpass filter 46 which prevents rapid changes in the phase difference between the output signals of the storage frequency divider 31′ and those of the reference frequency divider 30. The lowpass filter 46 is connected between the output of the three-point switch 45 and its inverting input, so that a pulse-duration modulator is obtained, the output pulses of which have a duty cycle which increases with the magnitude of the signal fed-in at the input 52. Thus, with this arrangement, the larger the signal fed to the input 52 the faster will be the change in the phase difference and, hence, the change in the analog signal appearing at the output 36′.

Figure 4:
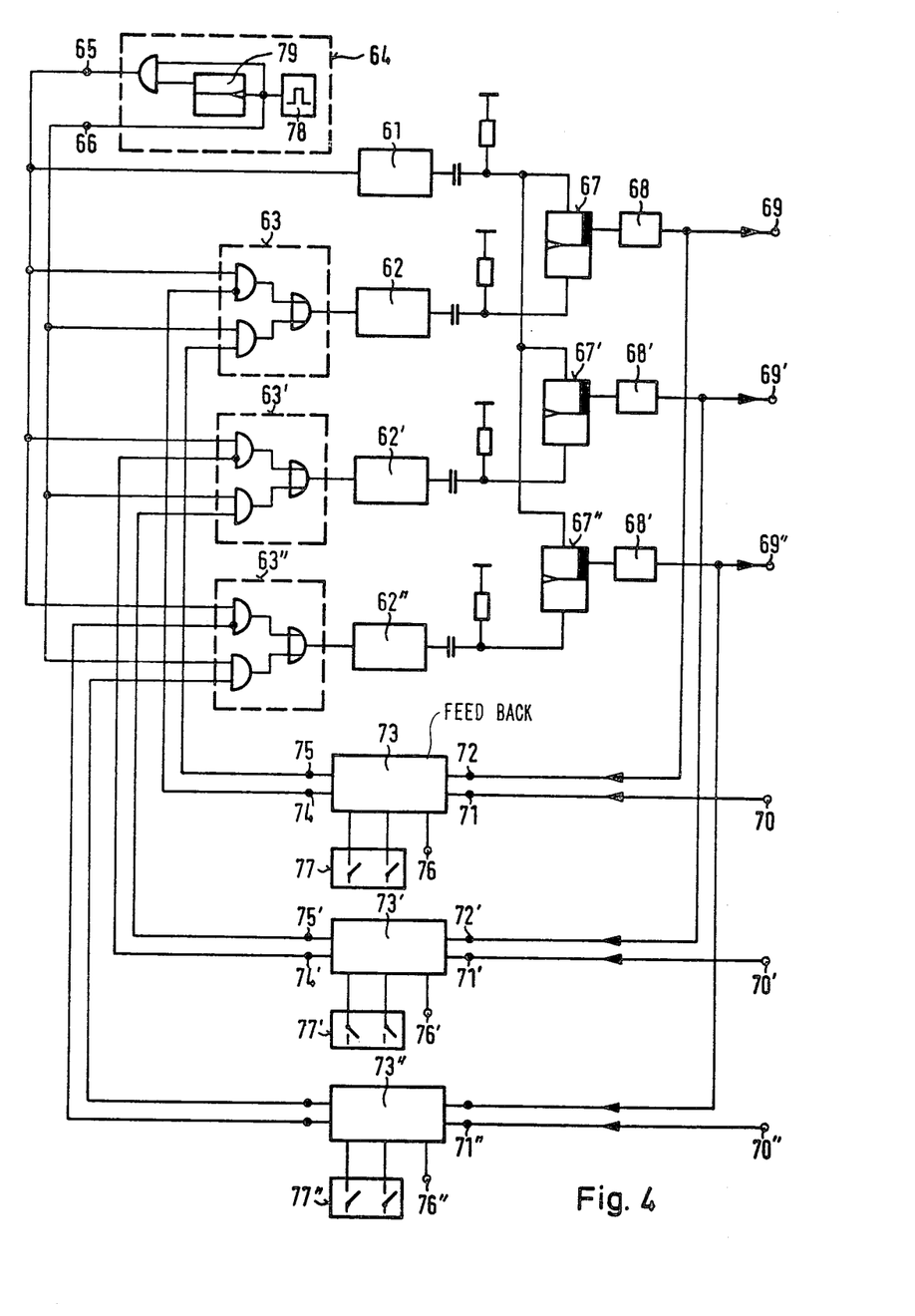
FIGS. 4 and 6 show two further circuit arrangements for storing several analog signals in accordance with the principles of the invention.

While the arrangements of FIGS. 1 and 3 permit the generation of an analog signal which can be varied by means of control signals, the circuit arrangement of FIG. 4 can be used to both generate replicas of and store analog signals which are fed to the inputs 70, 70′ and 70″ of the arrangement. In the arrangement of FIG. 4, a clock generator 64 includes an oscillator 78, the output signals of which are fed, on the one hand, directly to an output 66 and, on the other hand, via a bistable multivibrator 79 and an AND gate 80, to an output 65. At these two outputs, pulse trains are thus formed having pulses of the same duration, but frequencies which differ by a factor 2. These pulse trains are fed to logic members 63, 63′, 63″, which are of the same design as the logic members 39, 39′, and 39″ in the circuit of FIG. 3.

Storage frequency dividers 62, 62′, 62″ are connected to the outputs of the members 63, 63′ and 63″, while a reference frequency divider 61 is connected directly to the output 65 of the clock generator 64. The differentiated output signals of the reference frequency divider 61 are coupled to one input of each of the bistable multivibrators 67, 67′, 67″, while other inputs of these multivibrators are connected via differentiating members to the outputs of the storage frequency dividers 62, 62′, 62″. Lowpass filters 68, 68′, 68″ form the average values of the output signals of the multivibrators 67, 67′, 67″ and couple these average values signals to outputs 69, 69′, 69″.

The output signal of the lowpass filter 68 is also coupled to an input 72 of a feedback network 73, where it is compared with the analog signal which is to be stored and which is fed to an input 71 of the feedback circuit 73 from the input 70. Depending on the difference of the signals at the inputs 71 and 72, the feedback network 73 forms control signals which are delivered, via the outputs 74 and 75, to the logic member 63, which logic member is associated with the storage frequency divider 62, i.e., with the storage frequency divider from the output signal of which the analog signal fed to the input 72 is derived. The feedback network 73 drives the logic member 63 in such a manner that its output pulses have a phase difference relative to those of the reference frequency divider 61 such that the analog signal produced at the output 69 is equal to the analog input signal fed-in at the input 70. The latter is brought about by the further application of a corresponding control signal to one input 76 of the feedback network 73. A further circuit arrangement 77 is also provided for incrementally changing the status of the storage frequency divider 62 via the operation of the switches included in the arrangement.

A further feedback network 73′ is also provided and is connected with its input 72′ to the output of the lowpass filter 68′. This network compares the latter output signal with an analog signal which is to be stored and which is applied to its input 71′ via the input 70′. At the outputs 74′ and 75′ of the network 73′ appear output signals which control the logic member 63′ in such a manner that the phase difference of the output pulses of the storage frequency divider 62′ and those of the reference frequency divider 61 is adjusted so that the output signal of the lowpass filter 68′ becomes equal to the analog signal which is present at the input 70′. This is again brought about by applying a further control signal to another input 76′ of the network 73′. The signal at the input 76' can also be used to render the feedback network 73' inoperative, whereby the last feedback signal at the output 69 is maintained.

Similarly, still a further feedback network 73" is also provided in the circuit of FIG. 4 for the storage frequency divider 62" and operates to cause the signal delivered, via the output 69" to follow the signal present at the input 71" and, hence, the input 70". The circuit 73" also has a control input 76" for bringing about the aforesaid feedback operation as well as for stopping such action.

Additionally, in the circuit of FIG. 4 further switches 77, 77' and 77" are provided for incrementally changing the status of the storage frequency dividers 62, 62' and 62".

Figure 5:
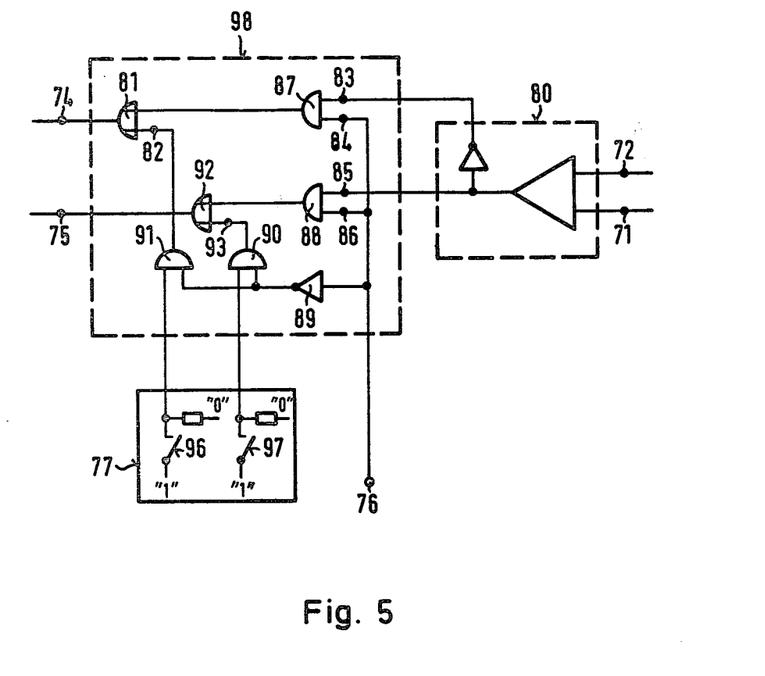
FIG. 5 illustrates the details of the feedback network employed in the arrangement of FIG. 4.

FIG. 5 shows the details of the feedback network 73 employed in the circuit of FIG. 4. Similar networks can be used for the networks 73' and 73". As shown, the inputs 71 and 72 are coupled to a comparator 80, which is followed by a logic circuit 98 which includes two AND gates 87 and 88. One input 83 of the AND gate 87 is connected to one of the outputs of the comparator 80, while the corresponding input 85 of the other AND gate 88 is connected to the other output of the comparator 80. The respective other inputs 84 and 86 of the AND gates 87 and 88 are coupled to the control input 76.

The outputs of the AND gates 87 and 88 are each connected, respectively, to an input of the OR gates 81 and 92. The other inputs 82 and 93 of these gates are, in turn, connected to outputs of two further AND gates 91 and 90. Corresponding respective inputs of the further AND gates 91 and 90 are connected via an inverter 89 to the control input 76. The respective other inputs of the further AND gates 91 and 90 are connected to switches 96 and 97 of the circuit arrangement 77. The switches 96 and 97 permit "1" signals to be connected to the outputs 74 and 75.

As discussed above, the analog output signal at the output 69 and the analog input signal at the input 70 are compared in the feedback network 73. This is accomplished by the comparator 80 which may, advantageously, also be a three-point switch. In the "feedback" mode of operation of the circuit 73, the input 76 is fed a "1" signal, so that the signals delivered by the comparator are passed by the AND gates 87 and 88. For one polarity of the difference voltage appearing at the inputs 71 and 72 of the comparator 80, a "1" signal is coupled to the OR gate 81 and, thereby, to the output 74. For the other polarity of the difference voltage, a "1" signal is coupled to the OR gate 92 and from there to the output 75. As above indicated these logic signals at the outputs 74 and 75 control the logic member 63 in such a manner that the difference of the signals fed to the inputs 71 and 72 becomes zero.

If a "0" signal is applied to the input 76, the AND gates 87 and 88 are blocked and the further AND gates 90 and 91 are released by the inverting member 89 for passing the signals from the switches 96 and 97. Normally, these switches are open, so that a "0" signal is coupled to one input of each of the AND gates 90 and 91 and, thereby, appears also at the inputs 82 and 93 of the OR gates and, thus, at the outputs 74 and 75. With such control signals, the associated storage frequency divider obtains the same number of clock pulses per unit time as the reference frequency divider, so that the phase difference of their output pulses and, thus, the analog output signal is constant. By operation of the switch 96 or the switch 97, the phase difference can be made larger or smaller.

Figure 6:
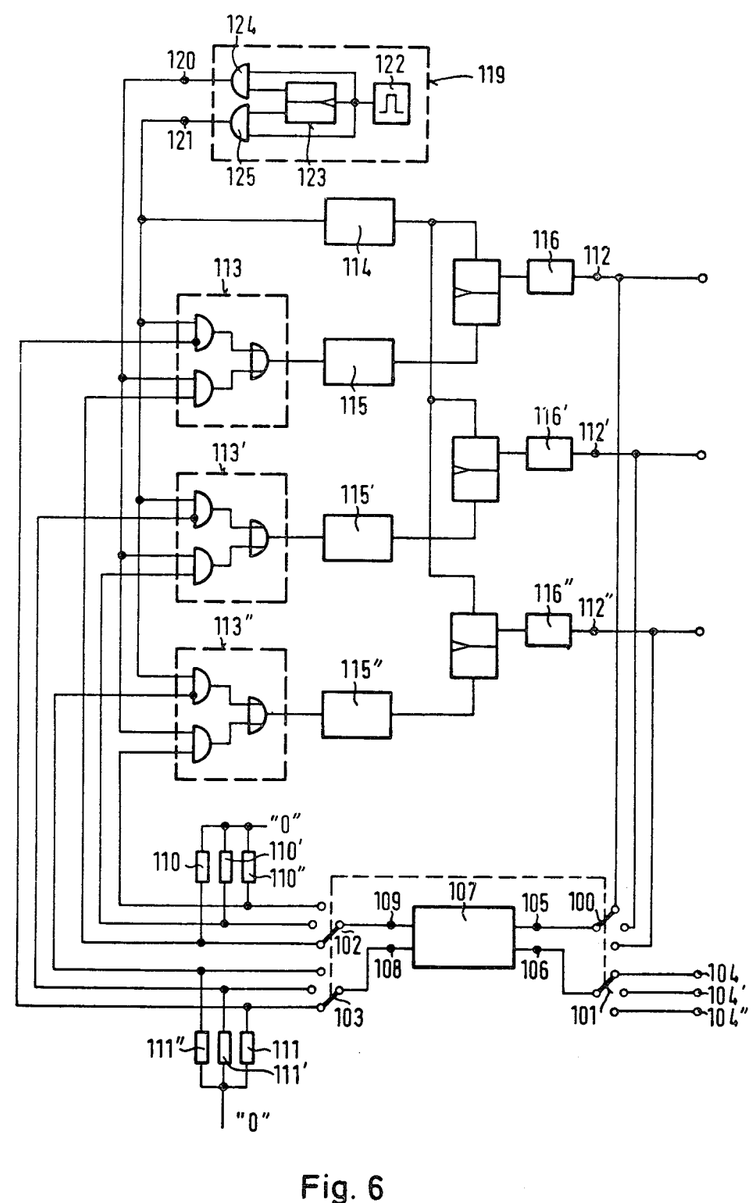

In the arrangement of FIG. 4, a feedback network is employed for each storage frequency divider. The circuit can be simplified and its cost reduced by employing only one feedback network which can be selectably assigned or connected via switches to each storage frequency divider. FIG. 6 shows such an arrangement.

More particularly, the arrangement of FIG. 6 comprises lowpass filters 116, 116', 116" having outputs 112, 112', 112". These filters smooth the output pulses of multivibrators which follow the storage frequency dividers 115, 115', 115". The signals at the outputs 112, 112', 112" are coupled to the contacts of a switch 100 whereby they are selectively coupled to one input 105 of a feedback network 107. The analog signals to be stored are applied to inputs 104, 104', 104" which can be selectively connected via a selector switch 101 to a second input 106 of the feedback network. The output signals of the feedback network appearing at the outputs 108 and 109 are selectively fed to the control inputs of logic members 113, 113', 113" via switches 102 and 103.

A clock generator 119 delivers at the outputs 120 and 121 two pulse trains which have the same frequency but whose pulses are mutually phase-shifted. The clock generator contains an oscillator 122, which drives a bistable multivibrator 123. The latter alternatingly releases two AND gates 124 and 125 for passing the pulses of the oscillator 122. Thus, one pulse of the oscillator 122 is switched to the output 120 and the following one of the output 121.

A "0" signal is applied to the connecting lines between the outputs of the switches 102 and 103 and the logic members 113, 113', 113" via resistors 110, 110', 110" and 111, 111', 111". Hence, the logic members not connected to the feedback network 107 at a particular time couple the "1's" at the output 121 of the clock generator 119 through and, thereby, provide the same clock generator pulses at their respective frequency dividers as appear at the reference frequency divider 114. The resistors 110, 110', 110" and 111, 111', 111" are included in OR gates, so that a "1" signal is fed to the logic members if the corresponding output 108 or 109 of the feedback network 107 is a "1" signal, and "0" signal is fed to such members if the corresponding output is a "0" signal.

Figure 7:
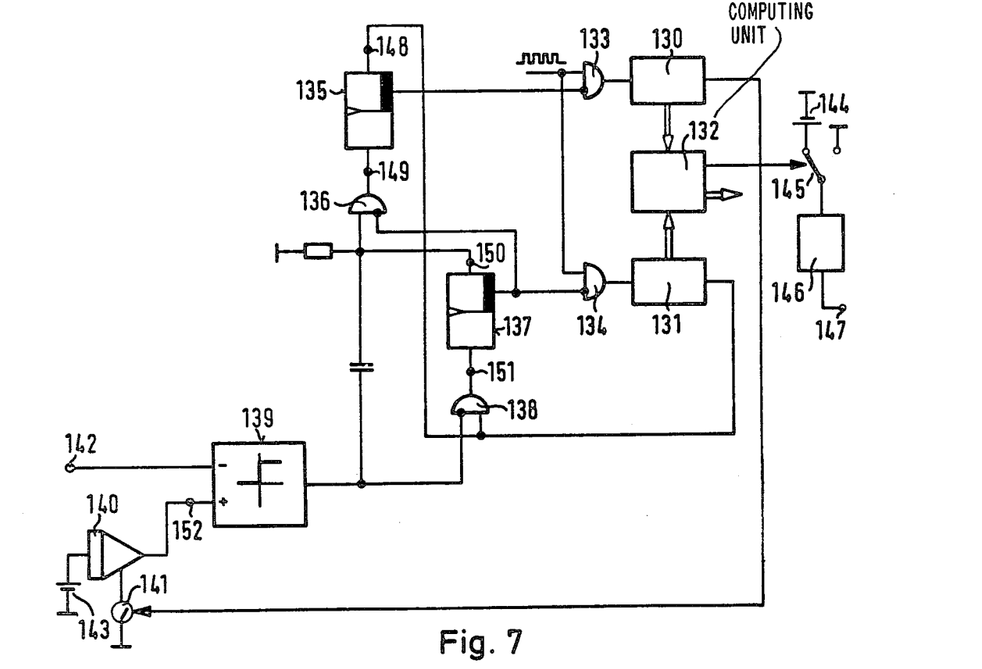
FIG. 7 shows another circuit arrangement for storing an analog signal in accordance with the principles of the present invention.

FIG. 7 shows a further arrangement for generating and storing an analog signal in accordance with the principles of the present invention wherein the analog signal is fed to a comparator 139 via an input 142. The analog signal is again stored in the form of the phase difference of the output pulses of two frequency dividers 130 and 131. The outputs of the frequency dividers are coupled to a phase comparison circuit which in this arrangement is in the form of a computing unit 132. The latter unit forms the phase difference of the clock pulses summed up in the frequency dividers 130 and 131 which in this case are designed as counters. The overflow and sign signal outputs of the unit 132 operate a switch 145 which in one position connects a lowpass filter 146 to a reference voltage source 144 and in its other position connects the lowpass filter to ground potential. The desired analog signal appears at an output 147. Instead of this phase comparison circuit, one of the types of phase comparison circuits described in the previous arrangement could also be used.

The output pulses of the frequency divider 130 close a switch 141 which discharges in its closed position an integrator 140 which is connected to a reference voltage source 143. THe integrator output is connected to the second input 152 of the comparator 139. The latter drives two gate circuits 136 and 138, to whose outputs the respective inputs 149, 151 of bistable multivibrators 135 and 137 are connected. The outputs of the latter are connected to an input of further gate circuit 133 and 134, respectively. The other inputs of the gate circuits are fed the pulses of a clock generaor, while the outputs of the circuits are connected to the inputs of the frequency dividers 130 and 131.

Figure 8:
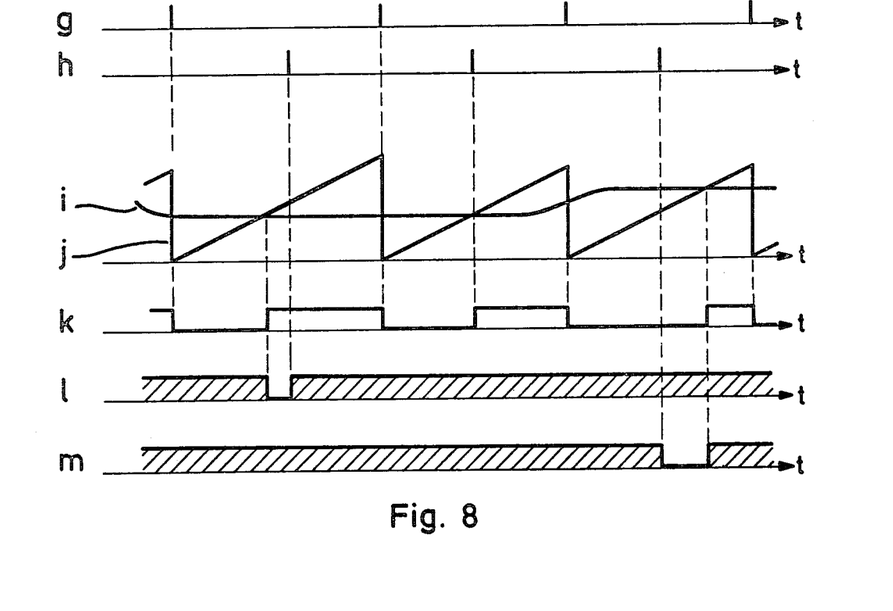
FIG. 8 illustrates waveform diagrams for explaining the operation of the arrangement of FIG. 7.

The operation of the circuit arrangement of FIG. 7 will be explained by making reference to FIG. 8 wherein: the waveform g shows the transfer pulses of the frequency divider 130; the waveform h illustrates the transfer pulses of the frequency divider 131; the waveform i shows the input voltage fed to the input 142; in diagram the waveform j illustrates the output voltage of the integrator 140; the waveform k illustrates the output voltage of the comparator 139; and the waveforms l and m show the respective states of the gate circuits 133 and 134.

Each output pulse of the frequency divider 130 causes the switch 141 to close and thereby discharge the integrator 140. At such time, the output voltage of the integrator becomes zero and, therefore, smaller than the input voltage. As a result, the output voltage of the comparator 139 becomes zero.

It will be first assumed that the two bistable multivibrators 135 and 137 are in such a state that the gate circuits 133 and 134 are released so as to permit passage of the input clock pulses and that the two frequency dividers 130 and 131 obtain an equal number of clock pulses per unit time. In such case, the gate circuit 136 is also released by the multivibrator 137. It is further assumed that the phase difference of the output pulses of the frequency dividers 130 and 131 is larger than that which would correctly correspond to the input signal at the input 142. The output pulse of the frequency divider 131, therefore, occurs after the point at which the increasing integrator output signal becomes equal to the aforesaid input voltage. If the integrator output voltage continues to increase and exceeds the input voltage, the comparator 139 delivers a "1" signal which is differentiated and is coupled through the released gate circuit 136 to the input 149 of the multivibrator 135. In response thereto, the latter flips over or changes state, so that the gate circuit 133 is cut off.

While the frequency divider 130, thus, becomes blocked, the output signal of the integrator 140 continues to rise and the comparator 139 continues to deliver a "1" signal, so that the gate circuit 138 remains cut off. The frequency divider 131, meanwhile, continues to receive clock pulses and its output pulse is coupled, on the one hand, to the input of the cut-off gate circuit 138 and, on the other hand, to the second input of the bistable multivibrator 135, which it resets to the state in which the gate circuit 133 is released. The divider 130, therefore, receives clock pulses again. It was, thus, blocked during that period between the occurrence of the pulse of the comparator 139 and the later occurrence of the output pulse of the divider 131.

The output pulse of the frequency divider 130 closes the switch 141 again, so that the integrator 140 is discharged and the output signal of the comparator 139 becomes zero. If the input signal has not changed since the last output signal of the frequency divider 131, then the next output pulse of the divider 131 now occurs at the instant at which the integrator output signal is equal to the input signal. The bistable multivibrators 135 and 137 are thereby driven simultaneously, so that they do not flip. The gate circuits 133 and 134, therefore, remain open during the entire integration period.

As shown by waveform i, the input signal undergoes an increase in amplitude after a period of time. At such time, the output signal of the frequency divider 131 occurs before the instant at which the integrator output signal is equal to the input signal. The comparator output signal is, therefore, still zero, so that the gate circuit 138 is opened to pass the output pulse of the frequency divider 131 to the input 151 of the bistable multivibrator 137. Thereby the multivibrator 137 is changed to that state in which the gate circuit 134 is blocked. At the same time, the multivibrator 137 cuts off the gate circuit 137. The divider 131 is therefore stopped. If the integrator output voltage exceeds the input signal, then the comparator 139 delivers a "1" signal which is coupled via the differentiating member, on the one hand, to cut-off the gate circuit 136 and is, thus, ineffective at the bistable multivibrator 135, and is fed, on the other hand, to the second input of the bistable multivibrator 137. The multivibrator 137 is thereby reset to the state in which it releases the gate circuit 134 to pass the clock pulses. The frequency divider 131 was, therefore, stopped during the period extending between the earlier occurrence of output pulse of the frequency divider 131 and the later occurrence of the integrator voltage becoming equal to the input voltage (see waveforms h, i, j, m). Thereby, the phase difference of the output pulses of the frequency dividers 130 and 131 is again adjusted so that the output pulse of the divider 131 occurs at the instance at which the integrator signal is equal to the input voltage.

In the circuit arrangement of the invention described above, the oscillator need not have a stable frequency. Moreover, even if the clock pulses fail, the information is statically retained in the frequency dividers, which can be utilized to recover the stored content. Advantageously, frequency dividers with a magnetic base, e.g., magnet flux counters, can be used in the circuits of the invention.

What is claimed is:

1. A circuit arrangement for storing an electric analog signal comprising:

first and second frequency dividers having the same divider ratio;
a clock generator;
a logic member connected to an input of each of said dividers through which a signal is coupled from said clock generator;
phase comparison means coupled to the outputs of said frequency dividers and containing a comparator and a feedback network coupling said comparator to said logic members;
means for supplying the electric analog signal to be stored to an input of said comparator;
an integrator having its output connected to a second input of said comparator and an input connected to a reference voltage source;
a switch responsive to the output of said first frequency divider for blocking the output of said integrator;
and further means connected to the output of said comparator for controlling said frequency dividers such that, from the instant at which the output signal of said integrator exceeds said analog input signal to the occurrence of an output pulse of said second frequency divider, a smaller number of clock pulses is fed to said first frequency divider than to said second frequency divider if, at the occurrence of the output pulse of said second frequency divider the output signal of said integrator is larger than said analog input signal, and such that, from the instant of occurrence of the output pulse of said second frequency divider to the instant at which the output signal of the integrator exceeds said analog input signal, a smaller number of clock pulses is fed to the second frequency divider than to the first frequency divider if the output pulse of the second frequency divider occurs within an integration period before the output voltage signal of the integrator reaches said analog input signal.

2. A circuit arrangement in accordance with claim 1 wherein:

said circuit arrangement further includes first and second gate circuits, having their outputs connected to said first and second frequency dividers, respectively;

and said further means causes the first gate circuit to be blocked from the instant at which the output signal of said integrator exceeds the analog input signal up to the occurrence of the output pulse of said second frequency divider, and causes the second gate circuit to be blocked from the occurrence of an output pulse of said second frequency divider to the instant at which the output signal of said integrator exceeds the said analog input signal.

3. A circuit arrangement in accordance with claim 2 further comprising:

first and second bistable multivibrators having outputs connected to said first and second gates, respectively, said first and second bistable multivibrators having first inputs connected to the outputs of said second frequency divider and said comparator, respectively;

a third gate circuit having a first input connected to the output of said second multivibrator and a second input responsive to the output of said comparator so as to cause said third gate to be released when the output of said integrator exceeds said input analog signal, said third gate having an output connected to a second input of said second multivibrator;

a fourth gate circuit having a first input connected to the output of said comparator and a second input connected to the output of said second bistable multivibrator, said fourth gate having an output connected to the second input of said first multivibrator.

* * * * *